(12) United States Patent
Mirgorodski et al.

(10) Patent No.: US 7,113,427 B1
(45) Date of Patent: Sep. 26, 2006

(54) NVM PMOS-CELL WITH ONE ERASED AND TWO PROGRAMMED STATES

(75) Inventors: Yuri Mirgorodski, Sunnyvale, CA (US); Peter J. Hopper, San Jose, CA (US); Vladislav Vashchenko, Palo Alto, CA (US); Philipp Lindorfer, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 19 days.

(21) Appl. No.: 11/076,711

(22) Filed: Mar. 9, 2005

(51) Int. Cl.
*G11C 16/04* (2006.01)

(52) U.S. Cl. .................. 365/185.03; 365/185.28; 365/185.19; 365/185.29

(58) Field of Classification Search .......... 365/185.03, 365/185.28, 185.19, 185.29
See application file for complete search history.

(56) References Cited

U.S. PATENT DOCUMENTS

| | | | | |
|---|---|---|---|---|
| 5,172,338 A | * | 12/1992 | Mehrotra et al. | 365/185.03 |
| 5,754,475 A | * | 5/1998 | Bill et al. | 365/185.25 |
| 5,991,517 A | * | 11/1999 | Harari et al. | 714/3 |
| 6,137,723 A | | 10/2000 | Bergemont et al. | |
| 6,373,747 B1 | * | 4/2002 | Harari et al. | 365/185.09 |
| 6,788,572 B1 | | 9/2004 | Yamada et al. | |

OTHER PUBLICATIONS

U.S. Appl. No. 10/895,710, filed Jul. 8, 2004.
U.S. Appl. No. 10/895,711, filed Jul. 8, 2004.
U.S. Appl. No. 10/895,713, filed Jul. 8, 2004.
U.S. Appl. No. 10/895,712, filed Jul. 8, 2004.
U.S. Appl. No. 11/057,355, filed Feb. 14, 2005.
"Everything a System Engineer Needs to Know About Serial EEPROM Endurance", http://ww1.microchip.com/downloads/en/AppNotes/00537.pdf, © 1992 Microchip Technology Inc., 10 Pages.
Lorenzini, M. et al., "*A dual gate flash EEPROM cell with two-bits storage capacity*", Nonvolatile Memory Technology Conference, 1996., Sixth Biennial IEEE International, Publication Date: Jun. 24-26, 1996, pp. 84-90 Albuquerque, NM, USA, ISBN: 0-7803-3510-4.

* cited by examiner

*Primary Examiner*—Tuan T. Nguyen
(74) *Attorney, Agent, or Firm*—Beyer Weaver & Thomas, LLP (57) ABSTRACT

NVM cell for storing three levels of charge: one erased and two programmed states. The cell comprises a transistor structure providing a gate current versus gate voltage curve having a shape with a flat region or a second peak. To provide such a structure, one embodiment combines two parallel transistors having different threshold voltages, and another embodiment uses one transistor with variable doping. The gate current curve provides two programming zones. Programming the first state includes applying a voltage across a channel, ramping up a gate voltage in the first programming zone, followed by ramping it back down. Programming the second state comprises applying a voltage across a channel, ramping up a gate voltage past the first programming zone and into the second programming zone, followed by ramping it back down. Ramping the voltage back down may optionally be preceded by turning off the voltage across the channel.

20 Claims, 10 Drawing Sheets

NVM PMOS-CELL WITH ONE ERASED AND TWO PROGRAMMED STATES

CROSS REFERENCE TO RELATED APPLICATIONS

The present application is related to U.S. patent application Ser. Nos. 10/895,710, filed Jul. 8, 2004; 10/895,711, filed Jul. 8, 2004; 10/895,713, filed Jul. 8, 2004; 10/895,712, filed Jul. 8, 2004; and "Non-Volatile Memory Structure and Erase Method With Floating Gate Voltage Control", filed Feb. 14, 2005, Ser. No. 11/057,355, and U.S. patent application Ser. No. 11/078,761 entitled "Electrically Erasable Programmable Read Only Memory" filed Mar. 11, 2005 all of which are incorporated by reference herein for all purposes.

FIELD OF INVENTION

The present invention relates generally to semiconductor memory cells, and in particular to a non-volatile memory cell having one erased state and two programmed states.

BACKGROUND OF THE INVENTION

A non-volatile memory (NVM) cell is a semiconductor memory cell that maintains its state after power has been turned off. An example of such a cell is a stacked gate memory cell, comprising a transistor which has a source, a drain, a floating gate isolated by an oxide or other similar material, and a control gate above the floating gate.

For example, in the case of a PMOS (P-channel Metal Oxide Semiconductor) NVM cell, the current flowing through the cell depends on the voltage of the floating gate. Since the floating gate is isolated and not directly accessible for the purposes of changing its voltage, the voltage is altered via one of two mechanisms: (1) introducing some charge into the floating gate, and (2) using surrounding voltages and capacitive coupling (i.e. the capacitance between the floating gate and the surrounding elements) in order to change the floating gate voltage by applying a voltage to the control gate or other electrodes.

There are three operations that can be performed on such a stacked cell: Read, Program and Erase. Reading the stacked cell refers to applying a voltage between the source and the drain, followed by sensing the amount of current flowing between the source and drain. A high level of current flow indicates one state of the cell (e.g. the "ON" state), while a low level of current flow indicates the other state (e.g. the "OFF" state).

Programming the stacked cell refers to causing negative charges to accumulate into the floating gate. If this negative charge is large enough, the voltage will fall below a threshold voltage, and as a result the channel will be on (i.e. the channel will be conducting). When the channel is on, a Read operation will sense a high level of current flow, indicating that the stacked cell is "ON". This in turn indicates that a "1" bit (or a "0" bit, depending on the agreed-upon convention) is stored in the cell.

Erasing the stacked cell refers to an operation which is opposite the Program operation, causing a removal of negative charges from the floating gate. As a result, the voltage of the floating gate will be positive (or simply above a voltage threshold), causing the channel to be turned off (i.e. become non-conducting). When the channel is turned off, a Read operation will sense a low level of current flow, indicating that the stacked cell is "OFF". This in turn indicates that a "0" bit (or a "1" bit, depending on the agreed-upon convention) is stored in the cell.

Since a conventional NVM cell has only two states (one programmed state and one erased state), it can store only one bit of information. While this works well, it limits the storage capacity of the cell. Therefore, having an NVM cell capable of assuming more than two states improves memory capacity by allowing the cell to store more than one bit of information.

SUMMARY OF THE INVENTION

To achieve the foregoing and other objects and according to the purpose of the present invention, an NVM cell is disclosed that is capable of storing three levels of charge: one erased state and two programmed states. The invention comprises a transistor structure that provides a gate current versus gate voltage curve having a shape with a flat region or a second peak. To provide such a structure, one embodiment combines two transistors in parallel, with the transistors having different threshold voltages, while another embodiment uses one transistor with variable doping in order to create the desired gate current curve. The gate current curve provides two programming zones. Programming the first state comprises applying a voltage across a channel, ramping up the gate voltage in the first programming zone, followed by ramping it back down. Programming the second state comprises applying a voltage across a channel, ramping up the gate voltage past the first programming zone and into the second programming zone, followed by ramping it back down. Optionally, ramping the voltage back down may be preceded by turning off the voltage across the channel.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

A PMOS NVM cell capable of storing three levels of charge, and methods for programming, erasing and reading the NVM cell are disclosed below. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

The present invention discloses an enhanced PMOS (P-channel metal-oxide-semiconductor) based NVM cell for storing three levels of charge corresponding to three states of the NVM cell. The NVM cell can be erased, resulting in an erased state, and it can be programmed in two ways, resulting in one of two possible programmed states.

The NVM cell comprises a transistor structure with a floating gate, and uses a control gate to control the voltage of the floating gate. Programming the NVM cell takes advantage of a special behavior of the floating gate current as a function of the floating gate voltage. This behavior, and the particular transistor structures capable of producing such behavior, will now be described, followed by a description of the steps for programming, erasing and reading the NVM cell.

Floating Gate Current Versus Floating Gate Voltage

Figure 1A:
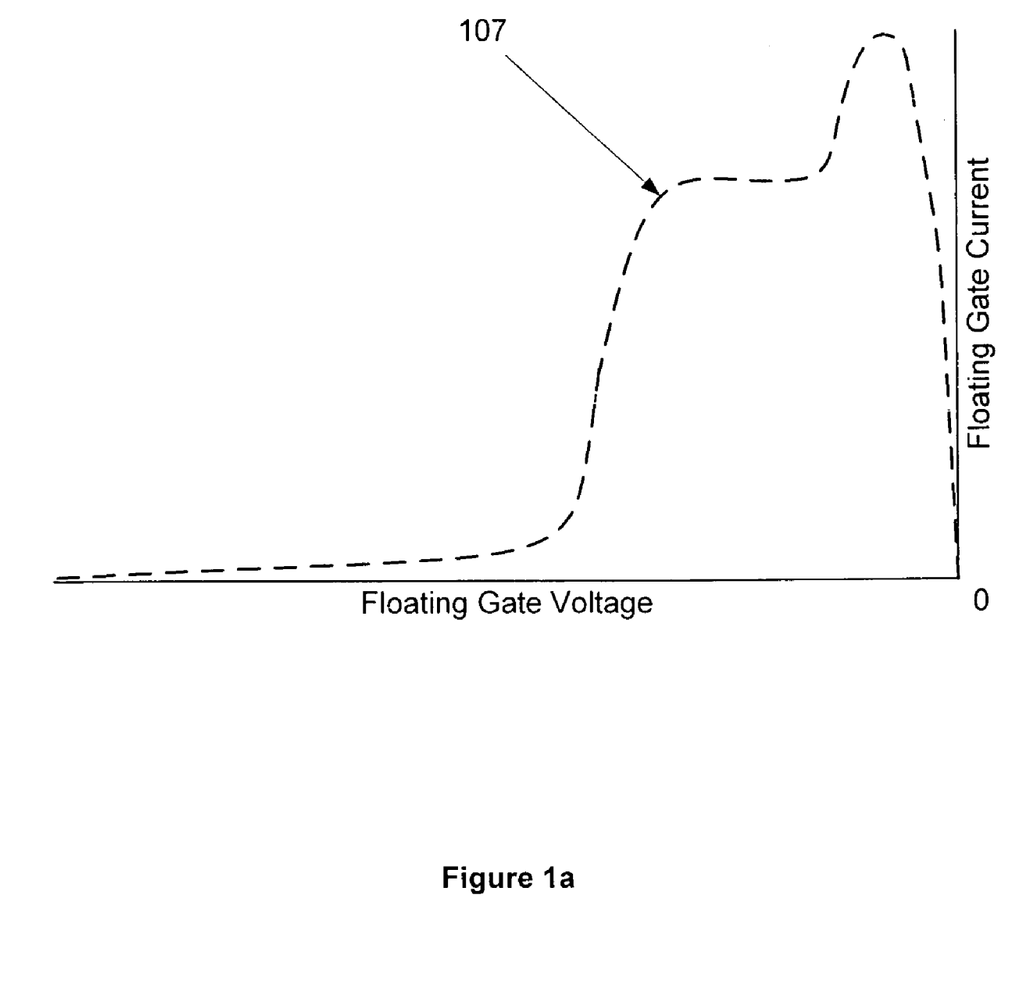
FIG. 1a shows a gate current versus gate voltage curve that comprises a flat region left of the current peak, in accordance with an embodiment of the present invention.
Figure 1B:
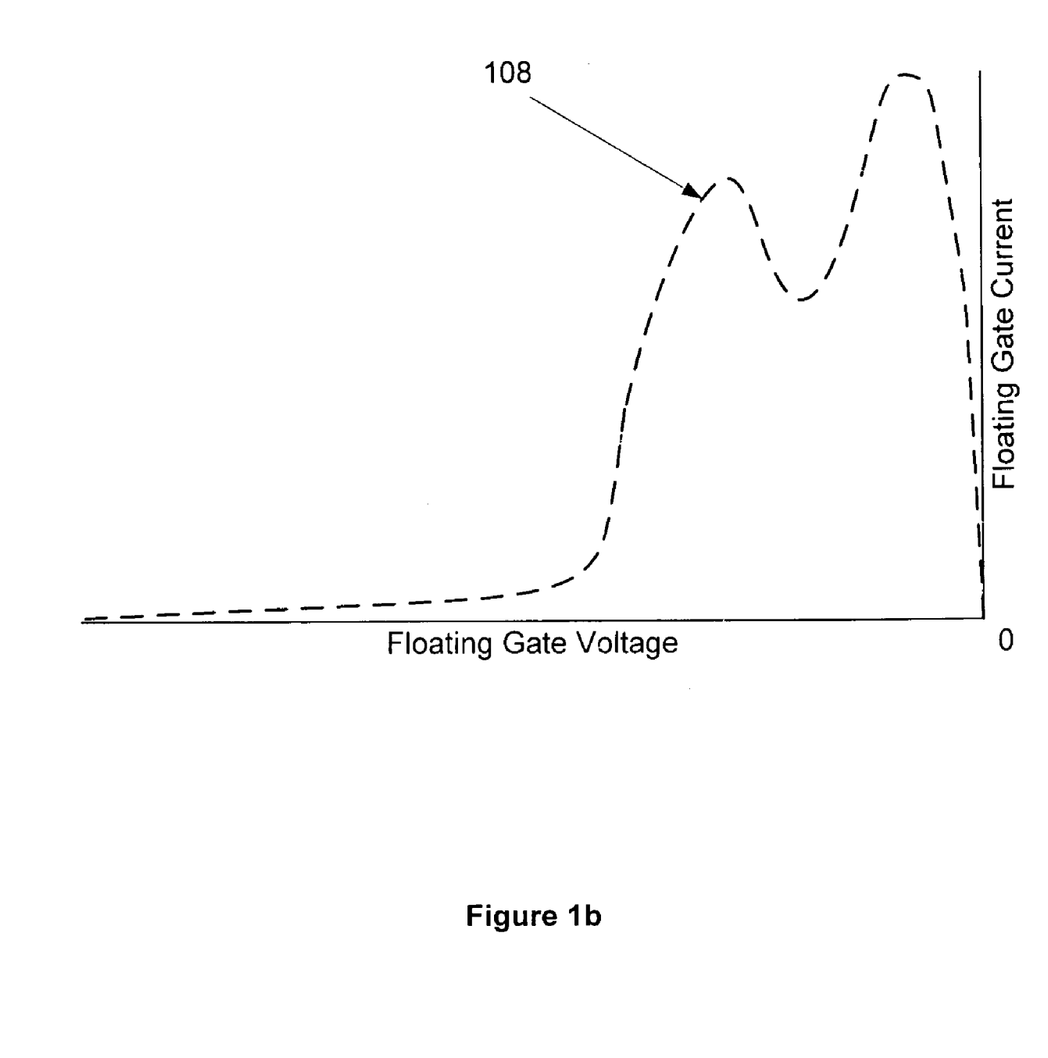
FIG. 1b shows a gate current versus gate voltage curve that comprises two current peaks, in accordance with an embodiment of the present invention.

FIGS. 1a and 1b illustrate two exemplary floating gate current versus floating gate voltage curves 107 and 108. In one embodiment of the present invention, the NVM cell comprises a transistor structure which exhibits a floating gate current versus floating gate voltage curve that is similar to curve 107 of FIG. 1a, with a flat region left of the current peak. In another embodiment, the NVM cell comprises a transistor structure which exhibits a floating gate current versus floating gate voltage curve that is similar to curve 108 of FIG. 1b, having two current peaks. In FIGS. 1a and 1b, the vertical axes represent the level of current flow into the floating gate 122 (increasing upward) from surrounding elements. The horizontal axes represent the voltage level of the floating gate 122 (decreasing towards the left).

Transistor Structures

Figure 2A:
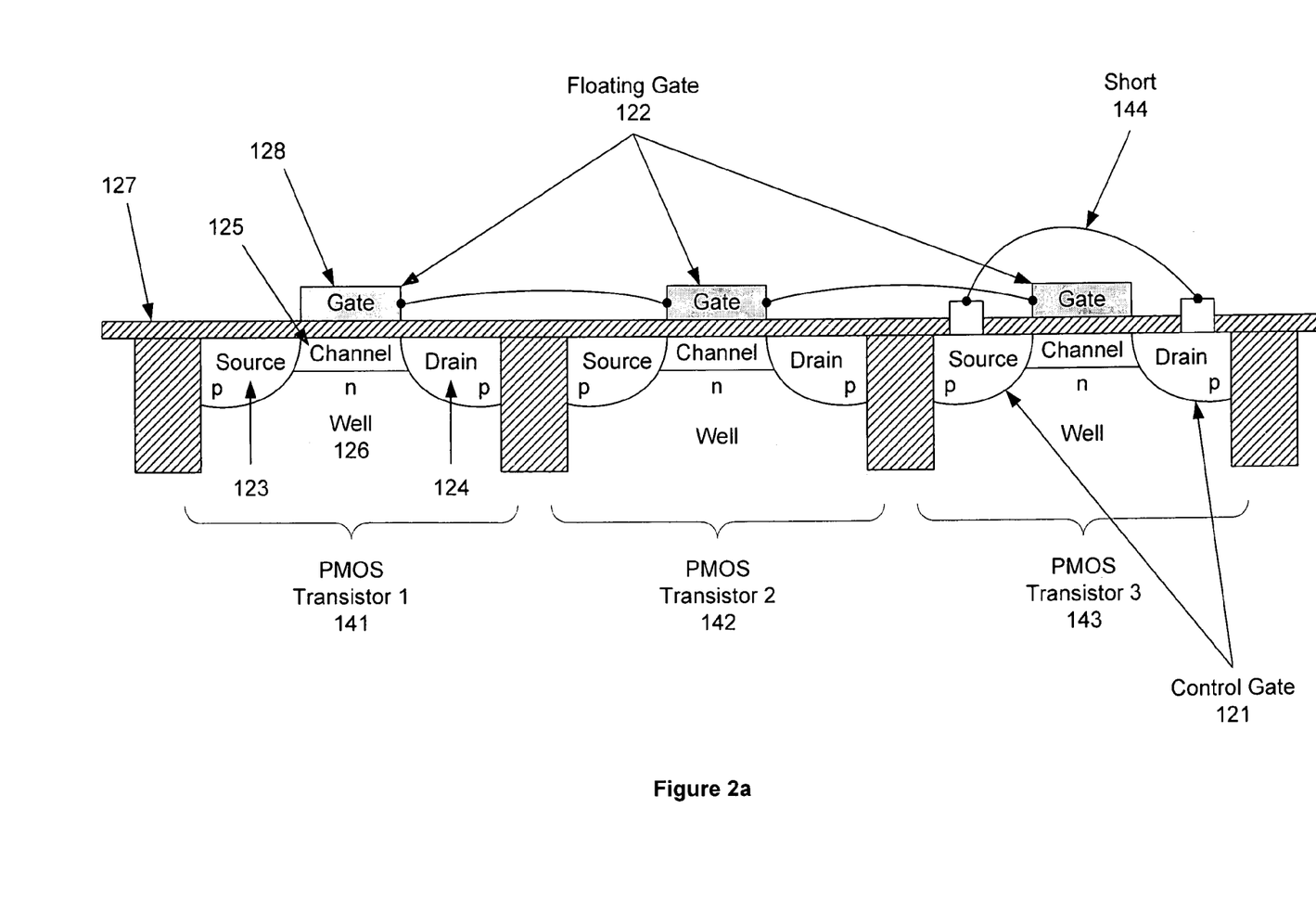
FIG. 2a is a diagrammatic cross-section view of a transistor structure using two transistors with different threshold voltages, in accordance with an embodiment of the present invention.

To provide such an appropriate transistor structure capable of exhibiting a floating gate current versus floating gate voltage curve as shown in FIG. 1a or 1b, one embodiment of the present invention uses two transistors with different threshold voltages, as shown in the diagrammatic cross-section view of FIG. 2a. Transistors 141, 142 and 143 are laid out in a line, with each transistor comprising a source 123, a drain 124, a channel 125, a well 126, a gate 128, with an oxide layer for isolating the gates 128. The two transistors 141 and 142 have different threshold voltages (VT). By way of example, transistor 141 may have a threshold voltage of $VT_1=0.7V$, whereas transistor 142 may have a threshold voltage of $VT_2=1.5V$. Other threshold voltages that are sufficiently apart work as well, and a voltage difference of approximately 0.5–2.5V has been found to work well. The gates 128 of the transistors are shorted and used as a single floating gate 122 for the composite transistor structure. The source 123 and the drain 124 of transistor 143 are shorted 144 and used as a control gate 121. Although the short 144 is not necessary, and either the source 123 or the drain 124 of transistor 143 can be used individually as the control gate 121, using both results in a higher capacitive coupling between the control gate 121 and the floating gate 122. The difference in threshold voltages of transistors 141 and 142 gives rise to a floating gate current versus floating gate voltage curve similar to the curves shown in FIGS. 1a and 1b.

Figure 2B:
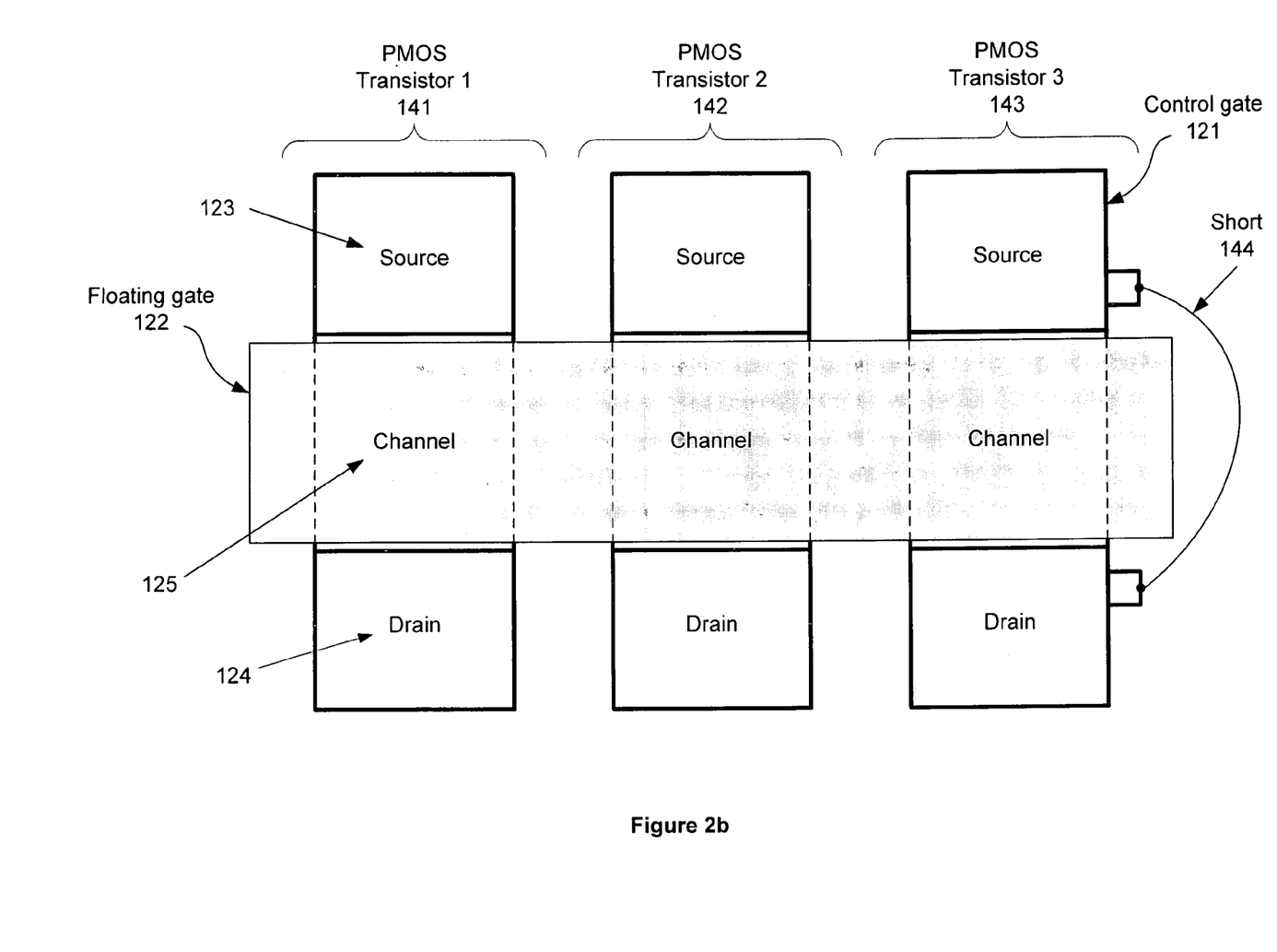
FIG. 2b is a diagrammatic top-section view of a transistor structure using two transistors with different threshold voltages, in accordance with another embodiment of the present invention.

FIG. 2b shows another embodiment using two different transistors having different threshold voltages, in accordance with an embodiment of the present invention. As shown, transistors 141, 142 and 143 are laid out in parallel. The individual gates 128 are not explicitly shown in FIG. 2b; only the floating gate 122 is shown. Transistors 141 and 142 have different threshold voltages, similar to the embodiment of FIG. 2a, and their gates are shorted to produce the floating gate 122. The source 123 and drain 124 of transistor 143 are shorted 144 to produce the control gate 121. However, similar to the embodiment of FIG. 2a, the short 144 is not necessary and either the source 123 or the drain 124 of transistor 143 can be used individually as the control gate 121 at the cost of lower capacitive coupling between the control gate 121 and the floating gate 122. As in the embodiment of FIG. 2a, the difference in threshold voltages of transistors 141 and 142 gives rise to a floating gate current versus floating gate voltage curve similar to the curves shown in FIGS. 1a and 1b.

It should be appreciated that different transistor threshold voltages can be produced by using different VT implants, by using different transistor materials, by changing the transistor length, width or other aspect of the transistor size, by applying back bias to the substrate, and/or by other methods. Whatever method or combination of methods is used, the goal of this embodiment is to combine two transistors having different floating gate current versus floating gate voltage curves, such that the summation of the curves has a flat region (as in FIG. 1a) or exhibits a double peak (as in FIG. 1b). In fact, more than two transistors can be used in arrangements that are analogous to FIGS. 2a and 2b, resulting in more than two flat regions and/or more than two peaks. Analogous to the three-state embodiments, such implementations can be used to construct an NVM cell with more than three states (i.e. more than two programmed states).

Figure 3:
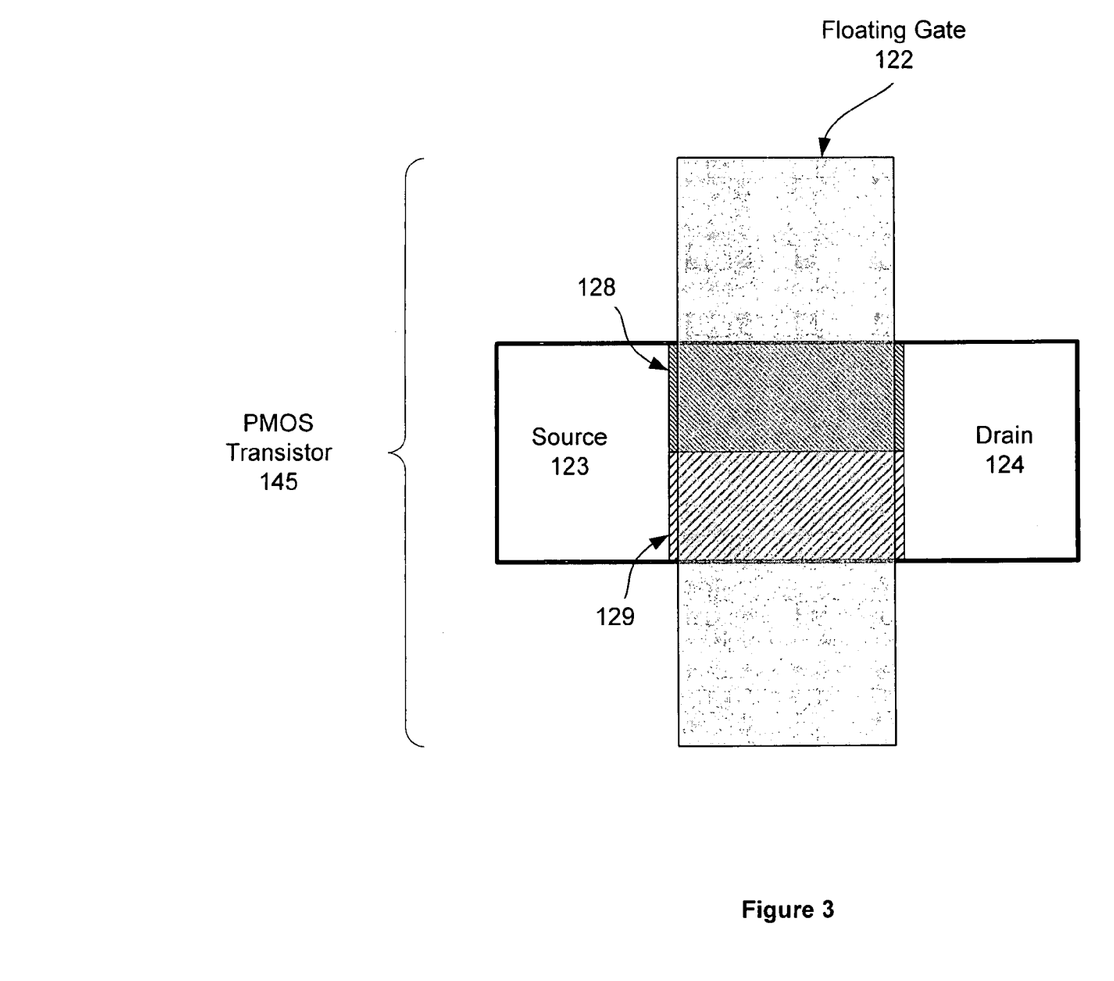
FIG. 3 is a diagrammatic top-view of a transistor structure using one transistor with different doping profiles across its channel, in accordance with an embodiment of the present invention.

Instead of using multiple transistors to create the different curves, an alternative embodiment of the present invention provides an appropriate transistor structure by using a single transistor which has different doping profiles across its channel, as illustrated in FIG. 3. In this embodiment, transistor 145 comprises two different doping profiles 128 and 129 across the transistor channel. Doping profile 128 provides a first threshold voltage $VT_1$, and doping profile 129 provides a different threshold voltage $VT_2$. As a result, the current versus voltage curve of this transistor will be as shown in FIG. 1a or FIG. 1b, depending on $VT_1$, and $VT_2$.

The gate of the transistor serves as the floating gate 122. A control gate 121 is either provided by an additional transistor, as in the embodiment of FIGS. 2a and 2b, or is provided by a stacked electrode on top of floating gate 122, as in a stacked cell, or provided by any other electrode which has capacitive coupling with floating gate 121.

Furthermore, note that above control gates are merely exemplary. Any element that provides capacitive coupling with the floating gate 122 and thereby allows control of the floating gate 122 can be used as a control gate 121. Furthermore, a more elaborate metal structure, such as with higher capacitance per area, can be used as a control gate with an increased degree of capacitive coupling with the floating gate. The present invention generally benefits from higher capacitive coupling between the control gate 121 and the floating gate 122, since a higher coupling ratio affords more control over the floating gate 122 voltage.

While the following description uses two-transistor embodiments to illustrate programming, erasing and reading the states of an NVM cell of the present invention, it is understood that programming, erasing and reading other embodiments of the present invention (e.g. using transistors with different doping profiles) are performed analogously, since the resulting gate current versus gate voltage curves are similar.

Operation of the NVM Cell

The first and second programmed states of the NVM cell are indicated by a first and second level of floating gate 122 voltage. The erased state of the cell is represented by a third level of floating gate voltage 122.

Figure 4A:
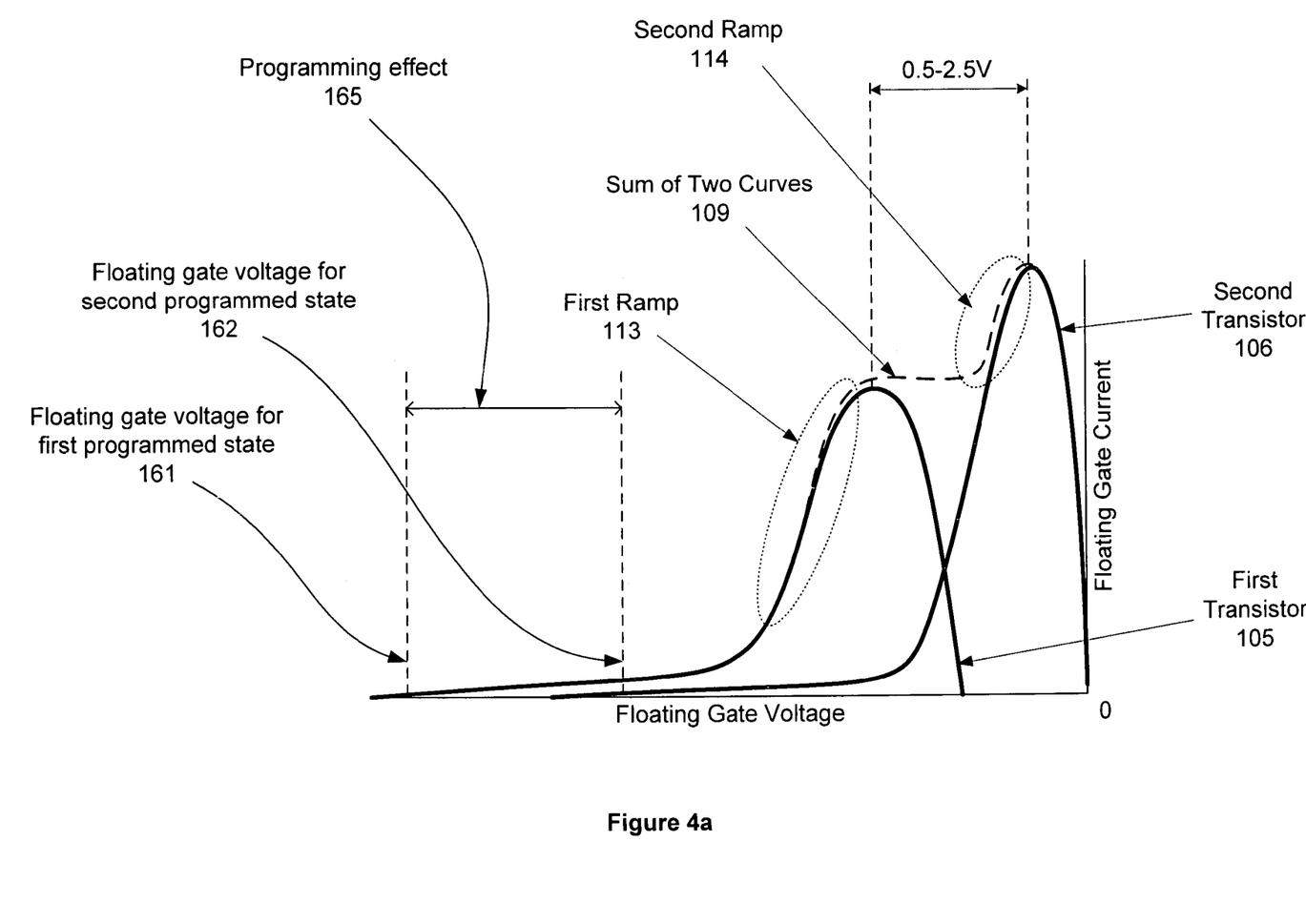
FIG. 4a shows a floating-gate current versus floating-gate voltage curve having a flat region, in accordance with an embodiment of the present invention using two parallel transistors.

FIG. 4a shows a floating-gate current versus floating-gate voltage curve 109 having a flat region, in accordance with an embodiment of the present invention using two transistors with different threshold voltages. Curves 105 and 106 correspond to the first and second transistors when one of the two transistor embodiments (e.g. FIG. 2a or 2b) is used. If a single transistor embodiment (e.g. FIG. 3) is used, then curves 105 and 106 correspond to the first and second doping profiles. Curve 109 is the aggregate (summation) of curves 105 and 106, and corresponds to the behavior seen when using the two transistors in parallel in an NVM cell. Each of the two floating gate current versus floating gate voltage curves 105 and 106 comprises one current peak, and the two curves are such that the relative shift in the position of their peaks causes the aggregate curve 109 to have a flat region running between the two peaks. There is a first ramp 113 left of the peak of curve 105 and a second ramp 114 left of the peak of curve 106. The voltage range of the first ramp 113 is hereinafter also referred to as the first programming zone, and the voltage range of the second ramp 114 is hereinafter also referred to as the second programming zone.

Figure 4B:
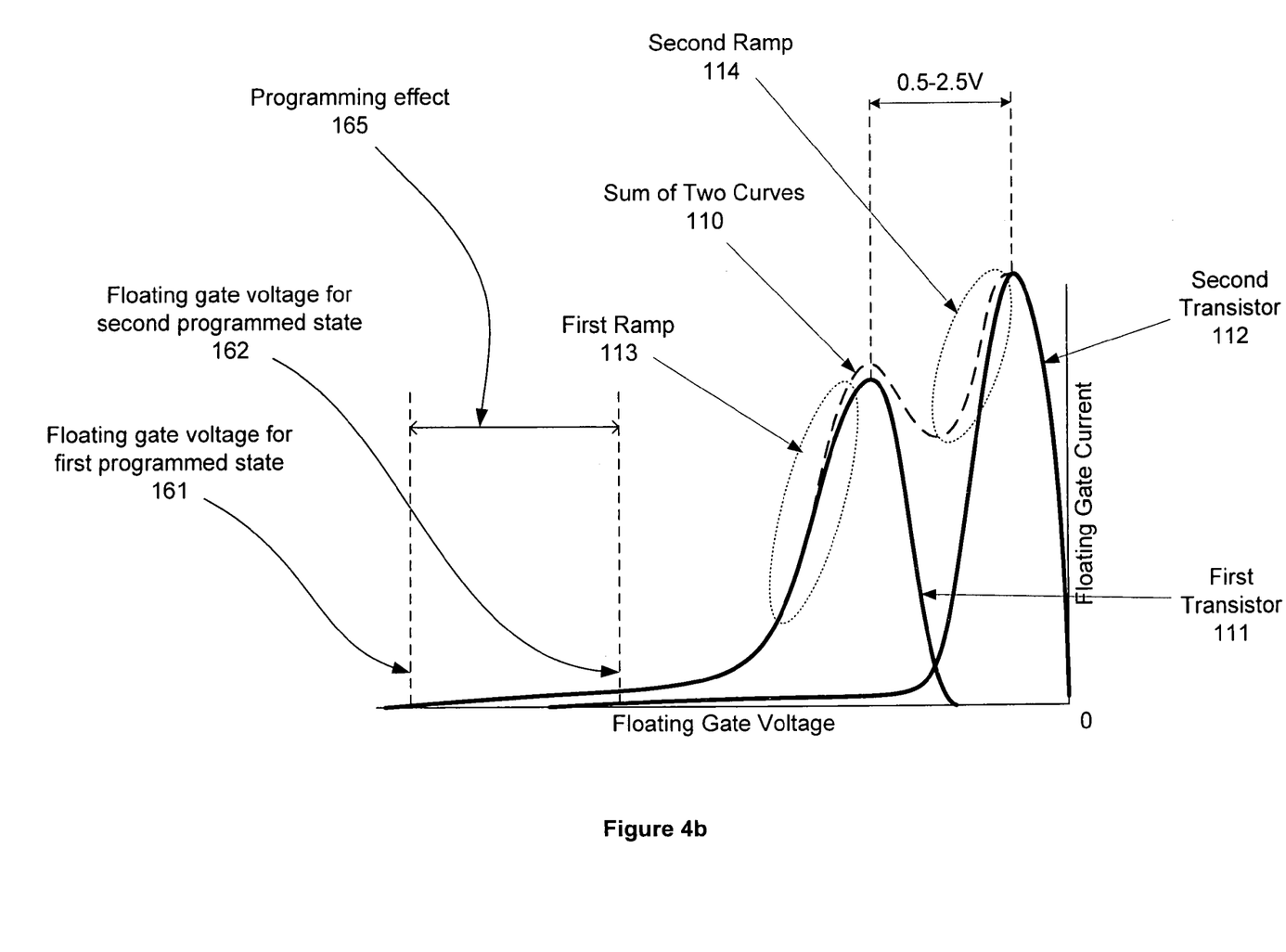
FIG. 4b shows a floating-gate current versus floating-gate voltage curve having two peaks, in accordance with another embodiment of the present invention using two parallel transistors.

FIG. 4b shows a floating gate current versus floating gate voltage curve 110 having two peaks, in accordance with another embodiment of the present invention using two parallel transistors. Similar to FIG. 4a, curves 111 and 112 correspond to the first and second transistors when one of the two transistor embodiments (e.g. FIG. 2a or 2b) is used. If a single transistor embodiment (e.g. FIG. 3) is used, then curves 111 and 112 correspond to the first and second doping profiles. Curve 110 is the aggregate (summation) of curves 111 and 112, and corresponds to the behavior seen when using the two transistors in parallel in an NVM cell. Each of the two floating gate current versus floating gate voltage curves 111 and 112 comprises one current peak, and the two curves are such that the relative shift in the position of their peaks causes the aggregate curve 110 to exhibit two peaks. As in FIG. 4a, there is a first ramp 113 left of the peak of curve 111 and a second ramp 114 left of the peak of curve 112, indicating the first and second programming zones.

Programming the Cell into the First or Second State

Figure 5A:
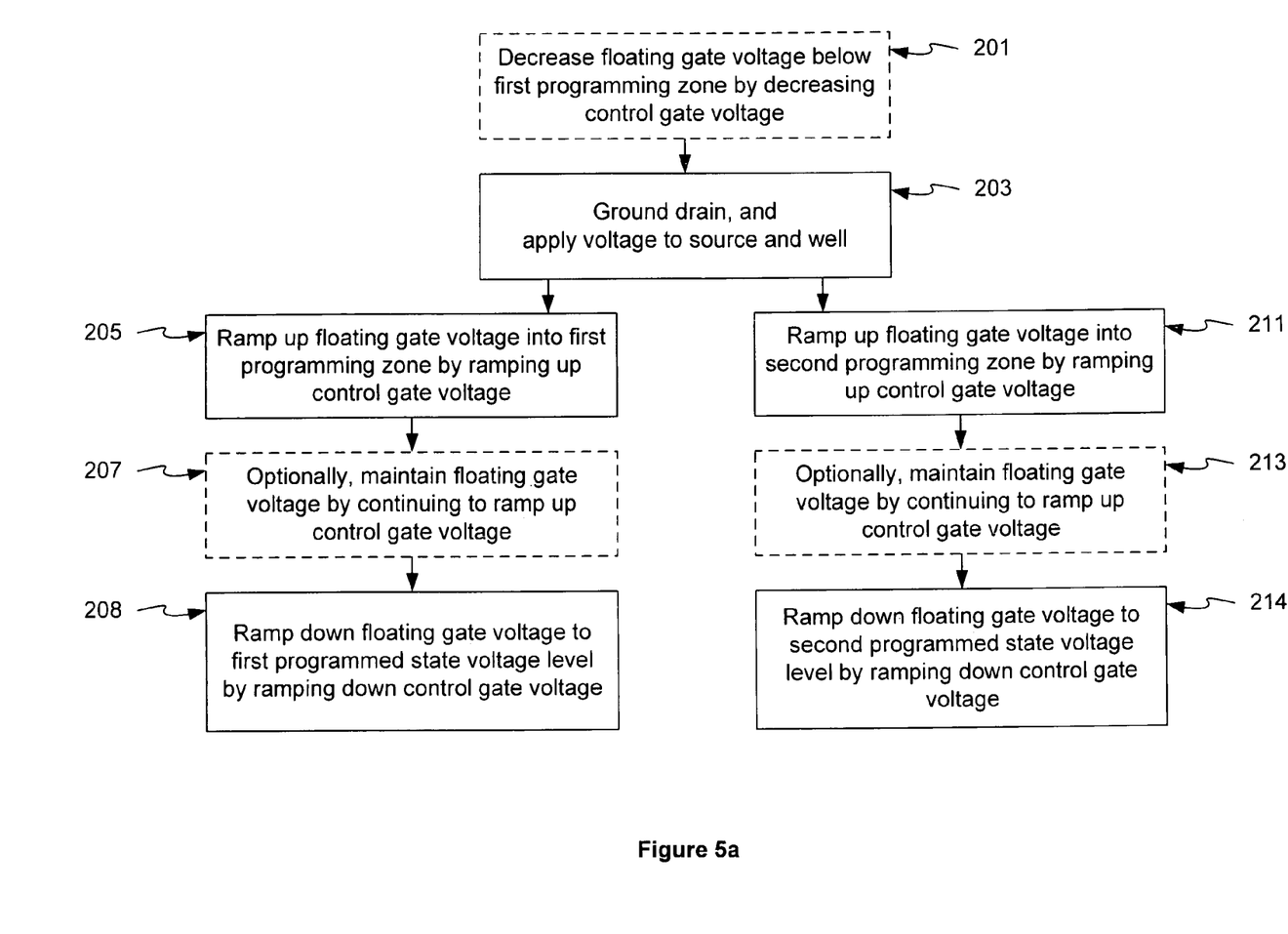
FIG. 5a is a flow chart illustrating steps for programming an NVM cell into the first second state, in accordance with an embodiment of the present invention.

Programming the PMOS NVM cell of the present invention into the first or second programmed state comprises ramping up the control gate 121 voltage, as illustrated in the flow chart of FIG. 5a in accordance with an embodiment of the present invention. Hereinafter, for the purposes of describing the programming, erasing and reading the NVM cell, the term "the source" refers collectively to the sources 123 of transistors 141 and 142 when an embodiment of FIG. 2a or 2b is used, or to the source 123 of transistor 145 when an embodiment of FIG. 3 is used, and similarly for the terms "the drain", "the channel" and "the well".

At 203, ground the drain 124 and apply a high voltage in the range of approximately 3–7V to the source 123 and the well 126. By way of example, a voltage of about 5V has been found to work well. At this point, the floating gate 122 voltage is normally below (i.e. to the left of) the first programming zone. If this is found not to be the case in a particular implementation, step 203 can be preceded by the optional step 201 of decreasing the voltage of the floating gate 122 to a negative value below the first programming zone (prior to the application of voltage to the source 123 and the well 126). This can be achieved by applying an appropriate level of negative voltage to the control gate 121, which, due to coupling, in turn causes the floating gate 122 voltage to reach the desired negative value. The appropriate level of control gate 121 voltage depends on the coupling ratio between the control gate 121 and the floating gate 122.

Figure 5B:
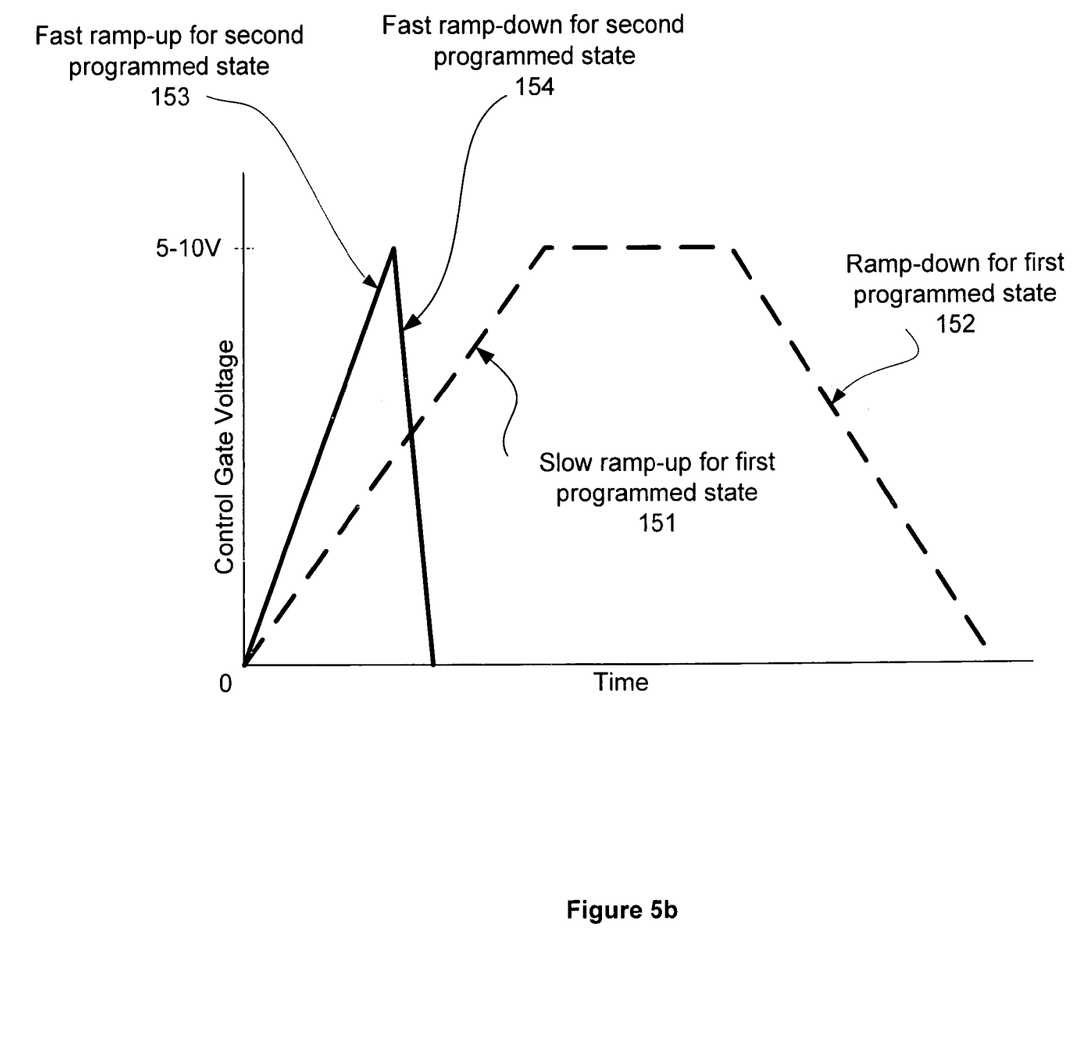
FIG. 5b is a diagram illustrating the relationship between the rate at which the floating gate voltage is ramped up and down for programming the first state versus for programming the second state, in accordance with an embodiment of the present invention.

At this point, the NVM cell can be programmed into the first or the second programmed state. To program the first state, at 205, slowly ramp up the voltage of the control gate 121 to approximately 5–10V, thereby increasing the floating gate 122 voltage into the first programming zone. By way of example, a voltage level of about 10V has been found to work well. It is important that the control gate 121 voltage not ramp up too quickly in order to prevent the floating gate 122 voltage from overshooting the first programming zone and missing the peak near the first ramp 113 which, as described below, is responsible for the hot electron injection current when programming the first state. The ramp-up period is generally on the order of microseconds to milliseconds and depends, among other things, on the behavior of the actual transistor structure in use and the capacitive coupling between the floating gate 122 and the control gate 121. FIG. 5b is a diagram comparing the rate at which the control gate 121 voltage is ramped up and down for programming the first state (ramp-up 151 and ramp-down 152) versus for programming the second state (ramp-up 153 and ramp-down 154), in accordance with an embodiment of the present invention. The actual rates of ramp up and ramp down depend on the floating gate current versus floating gate curve of the particular implementation, but the ramping rates for programming the first state are slower than those for programming the second state.

Upon ramping up 151 the control gate 121 voltage, and due to capacitive coupling between the floating gate 122 and the control gate 121, the voltage of the floating gate 121 rises to and within the first programming zone. The high lateral electric field creates hot electrons, and the rise in the perpendicular electric field helps hot electrons reach the floating gate 122 through the thin oxide layer between the channel 125 and the floating gate 122. The injection current essentially depends on the potential of the source 123 and well 126 (drain 124 is grounded), such that higher voltage between source 123 and drain 124 results in more injection. The floating gate 122 voltage, and with it the hot electron injection current, continue to rise until the injection current reaching the floating gate 122 compensates for the effect of coupling to the control gate 121. At this point, at 207, the voltage level of the floating gate 122 can be maintained for as long as the voltage of the control gate 121 continues to ramp up. In effect, the voltage of the floating gate 122 "surfs" the wave of the injection current near the right edge of the first ramp 113.

Next, at 208, ramp down 152 the control gate 121 voltage. Due to capacitive coupling, the floating gate 122 voltage drops to a level 161 (as shown on FIGS. 4a and 4b) indicative of the first programmed state. Note that the larger the drop in control gate 121 voltage, the larger the drop in floating gate 122 voltage.

Programming the second state is analogous to programming the first state, except that the second programming zone, and hence the current peak of the second transistor, is used to balance the hot electron injection current against the coupling effect of the control gate 121. To program the second state, at 211, ramp up 153 the control gate 121 voltage to approximately 5–10V, thereby increasing the floating gate 122 voltage past the first programming zone and into the second programming zone. By way of example, a voltage level of about 10V has been found to work well. It is important that the control gate 121 voltage ramp up at a high enough rate so as to move past the first programming zone and into the second programming zone, and at a low enough rate to avoid overshooting the second programming zone. As with programming the first state, the ramp-up period is generally on the order of microseconds to milliseconds and, as shown in FIG. 5b, is shorter than the ramp-up period of the first programming state, since unlike programming the first state the floating gate 122 voltage is to move past the first programming zone. As stated above, the ramp-up period depends, among other things, on the behavior of the actual transistor structure in use and the capacitive coupling between the floating gate 122 and the control gate 121.

Once again, due to coupling between the floating gate 122 and the control gate 121, the voltage of the floating gate 121 rises within the second programming zone. As with programming the first state, the high lateral electric field creates hot electrons and the rise in the perpendicular electric field helps hot electrons reach the floating gate 122 through the thin oxide layer between the channel 125 and the floating gate 122, with the injection current essentially depending on the potential of the source 123 and well 126 (drain 124 is grounded), such that higher voltage between source 123 and drain 124 results in more injection. The floating gate 122 voltage, and with it the hot electron injection current, continue to rise until the injection current reaching the floating gate 122 compensates for the effect of coupling to the control gate 121. Note that due to higher ramp-up speed, this effect is stronger than when programming the first state. At this point, at 213, the voltage level of the floating gate 122 can be maintained (if desired) for as long as the voltage of the control gate 121 continues to ramp up, with the voltage of the floating gate 122 "surfing" the wave of the injection current near the right edge of the second ramp 114.

Next, at 214, ramp down 154 the control gate 121 voltage. Due to capacitive coupling, the floating gate 122 voltage drops to a level 162 (as shown on FIGS. 4a and 4b) indicative of the second programmed state.

Preferably, the control gate 121 voltage is ramped down quickly in order to more fully utilize the capacitive coupling between the control gate 121 and the floating gate 122. Optionally, ramp-down of the control gate 121 voltage can be preceded by turning off the voltage across the channel 125, thereby reducing hot electron injection from the channel 125 to the floating gate 122.

The difference 165 between the voltage levels 161 and 162 of the first and second programmed states is called the "programming effect". Note that the size of the programming effect should be large enough for the programmed states to be distinguishable in order to provide for accurate reading of the NVM cell states, as described in more detail below in the read operation. One way to enlarge the programming effect 165 comprises the optional step 207 of maintaining the floating gate 122 voltage while continuing to ramp up the control gate 121 voltage. The longer the control gate 121 voltage ramp-up continues, the larger the drop at step 208 when ramping down the control gate 121 voltage, which in turn produces a larger drop to the final floating gate 122 voltage level 161. Similarly, another way to enlarge the programming effect 165 comprises limiting the continuing control gate 121 voltage ramp-up at optional step 213 (or entirely eliminating step 213), resulting in a limited floating gate 122 voltage drop to voltage level 162 at step 214. In general, the optional steps 207 and 213 allow for adjusting the size of the programming effect 165 by adjusting the voltage levels 161 and 162.

Erasing the Cell

Erasing the cell can be accomplished by using an arrangement wherein the floating gate 122 has low voltage and a nearby element, for example the control gate 121, has high voltage. This directs an electric field towards the floating gate 122 and gives electrons (negative charge) a chance to move away from the floating gate 122. If the applied voltage is high enough, electrons will in fact move away, thereby reducing the amount of negative charge residing at the floating gate 122. As a result, the floating gate 122 will have a voltage that is above the voltage level 162 indicative of the second programming state, thereby producing a level of channel 125 current during the read operation (described below) which is distinguishable from the channel 125 current produced at the first and second programming states. How to actually accomplish this depends on the capacitive coupling ratio between the control gate 121 and the floating gate 122.

If the capacitive coupling ratio between the control gate 121 and the floating gate 122 is low, a positive voltage in the range of approximately 12–17V, can be applied to the control gate 121. By way of example, a voltage of about 15V has been found to work well. Due to the low capacitive coupling ratio, the voltage of the floating gate 122 does not change by a large amount. For example, if the voltage of the floating gate 122 is about 0V prior to the application of the positive voltage to the control gate 121, the voltage of the floating gate 122 may increase by a small amount, for example to only about 2V, after the application of the large positive voltage to the control gate 121. As a result of the approximately 13V voltage difference between the floating gate 122 and the control gate 121, and if the oxide 127 between the floating gate 122 and the control gate 121 is thin enough, tunneling between the two gates causes electrons to flow from the floating gate 122 to the control gate 121. The result is a decrease in the amount of negative charge accumulated at the floating gate 122.

Conversely, if the capacitive coupling ratio between the control gate 121 and the floating gate 122 is high, an opposite mechanism is used. In this case, the control gate 121 is kept grounded, and a high positive voltage in the range of approximately 8–15V is applied to the source 123, the drain 124 and the channel 125 (i.e. the substrate or N-well), for example by shorting them. Because of the high capacitive coupling ratio, the voltage of the floating gate 122 remains close to ground, and the silicon (i.e. the source 123, the drain 124 and the channel 125) to acquire a high positive voltage. This causes electrons to tunnel from the floating gate 122 to the silicon. The result again is a decrease in the amount of negative charge accumulated at the floating gate 122. The amount of tunneling from the floating gate 122 to the silicon depends on the thickness and permittivity of the oxide 127 between the floating gate 122 and the silicon.

Reading the State of the Cell

Reading the cell determines whether it is in the first state, in the second state, or erased. To read the state of the cell, at 221 a voltage in the range of approximately 1–3V (i.e. low enough not to disturb the state of the NVM cell) is applied along the channel 125 between the source 123 and the drain 124, and a sense circuit determines the level of current flow across the channel 125, as illustrated in the flow chart of FIG. 6 in accordance with an embodiment of the present invention. One way to do this is by applying a negative voltage to the drain 124 while grounding the source 123 and the well 126. Alternatively, a positive voltage can be applied to the source 123 shorted with the well 126, while the drain 124 is grounded.

Figure 6:
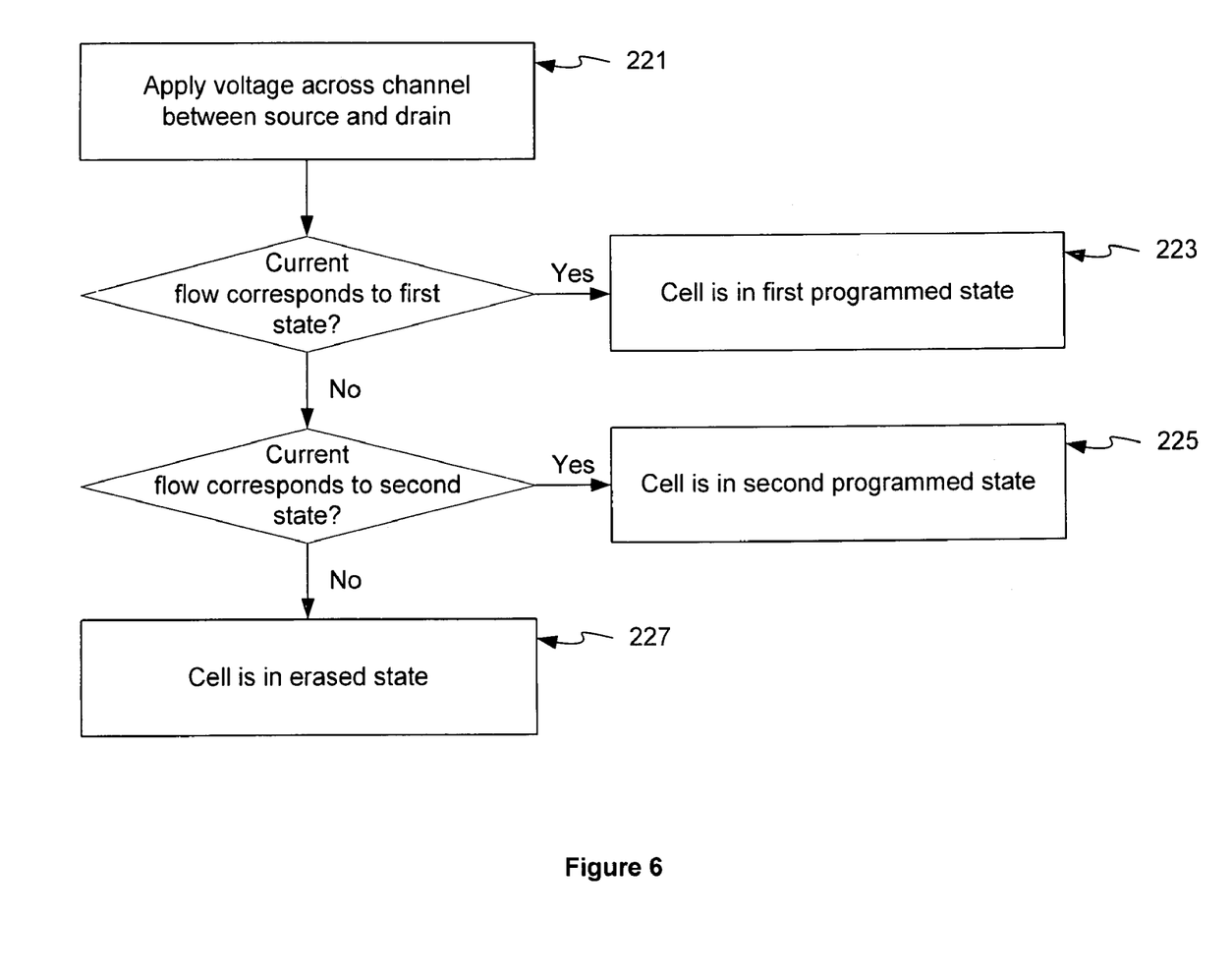
FIG. 6 is a flow chart illustrating steps for reading the states of an NVM cell, in accordance with an embodiment of the present invention.

If the floating gate 122 has a voltage indicative of the first programmed state (i.e. a voltage near level 161), then the channel 125 current is at a level indicative of the first programmed state and the sense circuit determines at 223 that the cell is in the first programmed state. If the floating gate 122 has a voltage indicative of the second programmed state (i.e. a voltage near level 162), then the channel 125 current is at a level indicative of the second programming state and the sense circuit determines at 225 that the cell is in the second programmed state. If the floating gate 122 has a voltage indicative of the erased state, then the channel 125 current is at a level indicative of the erased state and the sense circuit determines at 227 that the cell is in the erased state. Thereby, the sense circuit infers which of the three states the cell occupies by distinguishing between the corresponding three levels of current flow in the channel 125. The states of the cell can be named according to a convention. For example, one particular convention may name the erased state "0", the first state "1" and the second state "2".

Note that the voltage corresponding to the erased state is higher than the voltage level 162 of the second programmed state, and that the difference between the erased state and the second programmed state voltages need only be large enough to be distinguishable by the sense circuit. By way of example, a voltage difference of about 0.5–2V has been found to work well in order to produce distinguishable channel 125 currents. Furthermore, and as a special case, note that if the erased state voltage is above the threshold voltage, the channel 125 current during the read operation will be close to 0V and therefore distinguishable from the channel 125 current of the programmed states.

Foregoing described embodiments of the invention are provided as illustrations and descriptions. They are not intended to limit the invention to precise form described. Other variations and embodiments are possible in light of above teachings, and it is thus intended that the scope of invention not be limited by this Detailed Description, but rather by Claims following.

We claim:

1. A non-volatile memory (NVM) cell having a first and second programmed state and an erased state, comprising:
    a transistor structure having a floating gate (FG), the FG for maintaining a first or second programming voltage, the first and second programming voltages indicative of the first and second programmed states; and
    a control gate (CG);
    wherein ramping up the CG voltage at a first rate followed by ramping down the CG voltage results in the first programmed state, and ramping up the CG voltage at a second rate followed by ramping down the CG voltage results in the second programmed state.

2. An NVM cell as recited in claim 1, wherein the first programming voltage is smaller than the second programming voltage.

3. An NVM cell as recited in claim 1, the FG further for maintaining a third voltage indicative of the erased state.

4. An NVM cell as recited in claim 3, wherein the second ramp up rate is higher than the first ramp up rate.

5. An NVM cell as recited in claim 4, the transistor structure comprising a first and second transistor in parallel, the first transistor having a first threshold voltage, the second transistor having a second threshold voltage.

6. An NVM cell as recited in claim 4, the transistor structure comprising a transistor having a first and second doping profile across a channel of the transistor, the first doping profile indicative of a first threshold voltage, the second doping profile indicative of a second threshold voltage.

7. An NVM cell as recited in claim 4, wherein the transistor structure comprises one or more P-channel metal oxide semiconductor (PMOS) transistors.

8. An NVM cell as recited in claim 1, the transistor structure for producing an FG current versus FG voltage curve with a substantially flat region adjacent to an FG current peak, wherein the first ramp up rate is low enough to prevent the FG voltage from overshooting the voltage level of the FG current peak.

9. An NVM cell as recited in claim 1, the transistor structure for producing an FG current versus FG voltage curve with two FG current peaks, wherein the second ramp up rate is (a) high enough to increase the FG voltage past the voltage level of the lower FG current peak, and (b) low enough to prevent the FG voltage from overshooting the voltage level of the higher FG current peak.

10. A method for programming a non-volatile memory (NVM) cell having a first and second programmed state and an erased state, the NVM cell comprising a transistor structure having a floating gate (FG), the FG for maintaining a first or second programming voltage indicative of the first or second programmed state, the NVM cell having a control gate (CG), the method comprising:
    applying a voltage across a channel of the transistor structure;
    ramping up the CG gate voltage followed by ramping down the CG voltage, wherein:
    (a) when programming the first state, the ramping up proceeds at a first rate to set the FG voltage to the first programming voltage; and
    (b) when programming the second state, the ramping up proceeds at a second rate to set the FG voltage to the second programming voltage.

11. A method as recited in claim 10, wherein the first programming voltage is smaller than the second programming voltage.

12. A method as recited in claim 10, the FG further for maintaining a third voltage indicative of the erased state.

13. A method as recited in claim 12, wherein the second ramp up rate is higher than the first ramp up rate.

14. A method as recited in claim 13, the transistor structure comprising a first and second transistor in parallel, the first transistor having a first threshold voltage, the second transistor having a second threshold voltage.

15. A method as recited in claim 13, the transistor structure comprising a transistor having a first and second doping profile across the channel of the transistor, the first doping profile indicative of a first threshold voltage, the second doping profile indicative of a second threshold voltage.

16. A method as recited in claim 13, wherein the transistor structure comprises one or more P-channel metal oxide semiconductor (PMOS) transistors.

17. A method as recited in claim 10, the transistor structure for producing an FG current versus FG voltage curve with a substantially flat region adjacent to an FG current peak, wherein the first ramp up rate is low enough to prevent the FG voltage from overshooting the voltage level of the FG current peak.

18. A method as recited in claim 10, the transistor structure for producing an FG current versus FG voltage curve with two FG current peaks, wherein the second ramp up rate is (a) high enough to increase the FG voltage past the voltage level of the lower FG current peak, and (b) low enough to prevent the FG voltage from overshooting the voltage level of the higher FG current peak.

19. A method as recited in claim 10, further comprising:

erasing the NVM cell by applying a voltage to an element near the FG, thereby directing an electric field towards the FG and allowing negative charge to move away from the FG.

20. A method as recited in claim 10, further comprising:

determining whether the NVM cell is in the first programmed state, the second programmed state, or the erased state by applying a voltage along the channel and determining the level of current flow across the channel;

wherein a first level of current flow indicates the first programmed state, a second level of current flow indicates the second programmed state, and a third level of current flow indicates the erased state.

* * * * *

UNITED STATES PATENT AND TRADEMARK OFFICE
CERTIFICATE OF CORRECTION

| | | |
|---|---|---|
| PATENT NO. | : 7,113,427 B1 | Page 1 of 1 |
| APPLICATION NO. | : 11/076711 | |
| DATED | : September 26, 2006 | |
| INVENTOR(S) | : Mirgorodoski et al. | |

It is certified that error appears in the above-identified patent and that said Letters Patent is hereby corrected as shown below:

"Brief Description of Drawings", column 3, line 2, change "first second" to --first and second--.

Signed and Sealed this

Sixth Day of November, 2007

JON W. DUDAS
*Director of the United States Patent and Trademark Office*